United States Patent
Ino

(10) Patent No.: US 11,721,732 B2
(45) Date of Patent: Aug. 8, 2023

(54) SEMICONDUCTOR DEVICE WITH CONTROL ELECTRODES PROVIDED IN TRENCHES OF DIFFERENT WIDTHS

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Masataka Ino, Oita Oita (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/586,557

(22) Filed: Jan. 27, 2022

(65) Prior Publication Data
US 2023/0055520 A1 Feb. 23, 2023

(30) Foreign Application Priority Data
Aug. 18, 2021 (JP) .................................. 2021-133192

(51) Int. Cl.
*H01L 29/423* (2006.01)
*H01L 29/66* (2006.01)
*H01L 29/417* (2006.01)

(52) U.S. Cl.
CPC .... *H01L 29/42336* (2013.01); *H01L 29/4175* (2013.01); *H01L 29/66409* (2013.01)

(58) Field of Classification Search
CPC ......... H01L 29/42336; H01L 29/66409; H01L 29/41766; H01L 27/0617; H01L 29/404
See application file for complete search history.

(56) References Cited

U.S. PATENT DOCUMENTS

| 6,429,481 B1 | 8/2002 | Mo et al. |
| 8,222,109 B2 | 7/2012 | Yamamoto et al. |
| 8,629,505 B2 * | 1/2014 | Nishiwaki ......... H01L 29/66734 257/330 |
| 8,723,253 B2 | 5/2014 | Ohta et al. |

(Continued)

FOREIGN PATENT DOCUMENTS

| JP | 4450245 B2 | 4/2010 |
| JP | 2010-103260 A | 5/2010 |

(Continued)

*Primary Examiner* — Wasiul Haider
(74) *Attorney, Agent, or Firm* — Kim & Stewart LLP

(57) ABSTRACT

A semiconductor device includes a semiconductor part, first to third electrodes, and first and second control electrodes. The semiconductor part is provided between the first and second electrodes. On the second electrode side of the semiconductor part, the first control electrode and the third electrode are provided in a first trench, and the second control electrode is provided in a second trench. The first control electrode is provided between the second and third electrode. In a first direction from the first control electrode toward the second control electrode, the first trench has first and second widths. The first width is a combined width of the third electrode and insulating portions provided on both sides of the third electrode. The second width is a combined width of the first control electrode and the gate insulating films on both sides thereof. The first width is greater than the second width.

8 Claims, 13 Drawing Sheets

(56) References Cited

U.S. PATENT DOCUMENTS

| | | |
|---|---|---|
| 9,853,140 B2 | 12/2017 | Tipirneni et al. |
| 9,871,131 B2 | 1/2018 | Kobayashi |
| 2008/0305644 A1 | 12/2008 | Noda et al. |
| 2014/0284711 A1 | 9/2014 | Katoh et al. |
| 2020/0052077 A1* | 2/2020 | Altstaetter ........ H01L 29/66734 |

FOREIGN PATENT DOCUMENTS

| | | |
|---|---|---|
| JP | 2010-258252 A | 11/2010 |
| JP | 2012-059943 A | 3/2012 |
| JP | 4903055 B2 | 3/2012 |
| JP | 2012-204395 A | 10/2012 |
| JP | 5501684 B2 | 5/2014 |
| JP | 2014-187141 A | 10/2014 |
| JP | 5724635 B2 | 5/2015 |
| JP | 2017-162969 A | 9/2017 |
| JP | 6249571 B2 | 12/2017 |
| JP | 2018-152386 A | 9/2018 |

* cited by examiner

SEMICONDUCTOR DEVICE WITH CONTROL ELECTRODES PROVIDED IN TRENCHES OF DIFFERENT WIDTHS

CROSS-REFERENCE TO RELATED APPLICATIONS

This application is based upon and claims the benefit of priority from Japanese Patent Application No. 2021-133192, filed on Aug. 18, 2021; the entire contents of which are incorporated herein by reference.

FIELD

Embodiments relate to a semiconductor device and a method for manufacturing the same.

BACKGROUND

It is desirable for a power control semiconductor device to reduce the on-resistance. A MOS transistor that has a trench gate structure, for example, is preferably provided with a gate channel density increased by narrowing the arrangement spacing of the gate electrodes. The channel resistance can be reduced thereby, and the on-resistance can be reduced.

DETAILED DESCRIPTION

Figure 1:
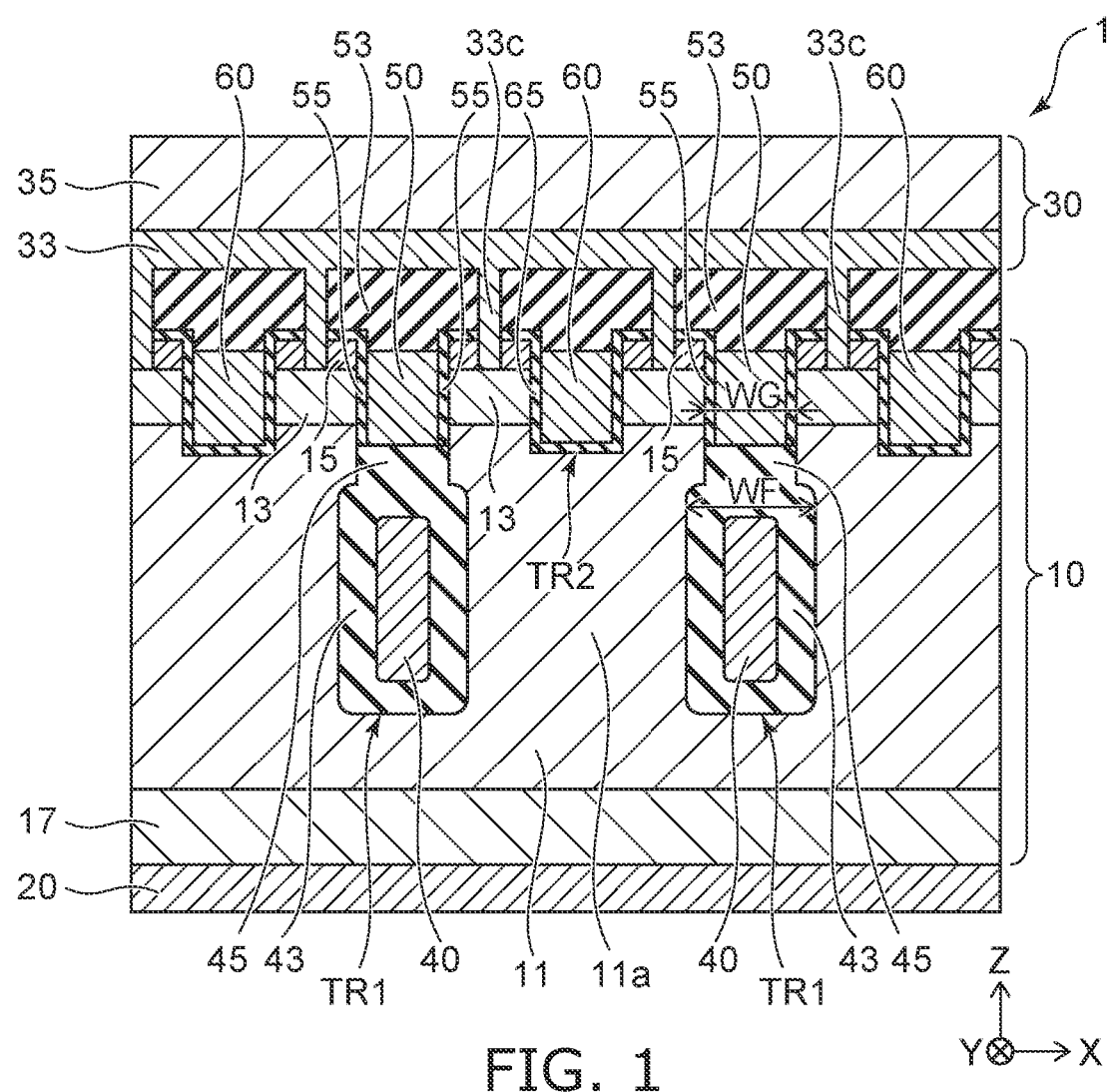
FIG. 1 is a schematic cross-sectional view showing a semiconductor device according to an embodiment.

According to one embodiment, a semiconductor device includes a semiconductor part, first to third electrodes, and first and second control electrodes. The semiconductor part includes a first semiconductor layer of a first conductivity type, a second semiconductor layer of a second conductivity type, and a third semiconductor layer of the first conductivity type. The first electrode is provided on a back surface of the semiconductor part. The second electrode is provided at a front side of the semiconductor part. The third electrode is provided between the first electrode and the second electrode. The third electrode is provided in a first trench at the front side of the semiconductor part. The third electrode is electrically insulated from the semiconductor part by a first insulating film. The first control electrode is provided between the second electrode and the third electrode. The first control electrode is provided in the first trench. The first control electrode is electrically insulated from the third electrode by a second insulating film, electrically insulated from the second electrode by a third insulating film, and electrically insulated from the semiconductor part by a fourth insulating film. The second control electrode is provided between the semiconductor part and the second electrode. The second control electrode is provided in a second trench next to the first trench in the front side of the semiconductor part. The second control electrode is electrically insulated from the semiconductor part by a fifth insulating film. The first semiconductor layer extending between the first electrode and the second electrode. The second semiconductor layer is provided between the first semiconductor layer and the second electrode. The second semiconductor layer faces the first control electrode via the fourth insulating film, and faces the second control electrode via the fifth insulating film. The third semiconductor layer is partially provided between the second semiconductor layer and the second electrode. The second electrode is electrically connected to the second and third semiconductor layers. The first and second trenches extend into the first semiconductor layer from the front surface of the semiconductor part. A spacing between the first trench and the first electrode is less than a spacing between the second trench and the first electrode. The third electrode in the first trench faces the first semiconductor layer via the first insulating film. The first insulating film includes first and second portions provided respectively at two sides of the third electrode. The first and second portions of the first insulating film are arranged in a first direction directed from the first control electrode toward the second control electrode. The fourth insulating film includes first and second portions provided respectively at two sides of the first control electrode. The first and second portions of the fourth insulating film are arranged in the first direction. The first trench has first and second width in the first direction. The first width is a combined width of the third electrode and the first and second portions of the first insulating film. The second width is a combined width of the first control electrode and the first and second portions of the fourth insulating film. The first width is greater than the second width.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is a MOS transistor that has a trench gate structure.

The semiconductor device 1 includes a semiconductor part 10, a first electrode 20, a second electrode 30, a third electrode 40, a first control electrode 50, and a second control electrode 60. The semiconductor part 10 is, for example, silicon.

The first electrode 20 is provided on the back surface of the semiconductor part 10. The first electrode 20 is, for example, a drain electrode. The first electrode 20 is, for example, a metal layer that includes aluminum (Al), nickel (Ni), etc.

The second electrode 30 is provided at the front side of the semiconductor part 10. The second electrode 30 is, for example, a source electrode. The second electrode 30 includes, for example, a first metal layer 33 and a second metal layer 35. The first metal layer 33 is provided between the semiconductor part 10 and the second metal layer 35.

For example, the first metal layer 33 has a stacked structure (not illustrated) that includes titanium nitride (TiN) and tungsten (W). The titanium nitride layer is provided between the semiconductor part 10 and the tungsten layer. The second metal layer 35 includes, for example, aluminum.

The semiconductor part 10 includes a first trench TR1 and a second trench TR2. The first trench TR1 and the second trench TR2 are provided at the front side of the semiconductor part 10 that faces the second electrode 30. The first trench TR1 and the second trench TR2 are provided at positions that are next to each other. The distance between the first trench TR1 and the first electrode 20 is less than the distance between the second trench TR2 and the first electrode 20.

The third electrode 40 and the first control electrode 50 are provided inside the first trench TR1. The first control electrode 50 is provided between the second electrode 30 and the third electrode 40. The third electrode 40 is, for example, a field plate that is electrically connected to the second electrode 30. The first control electrode 50 is, for example, a gate electrode. The third electrode 40 and the first control electrode 50 are, for example, conductive polysilicon.

The third electrode 40 is electrically insulated from the semiconductor part 10 by a first insulating film 43. The first control electrode 50 is electrically insulated from the third electrode 40 by a second insulating film 45. Also, the first control electrode 50 is electrically insulated from the second electrode 30 by a third insulating film 53. Moreover, the first control electrode 50 is electrically insulated from the semiconductor part 10 by a fourth insulating film 55. The fourth insulating film 55 is, for example, a gate insulating film. The first insulating film 43, the second insulating film 45, the third insulating film 53, and the fourth insulating film 55 are, for example, silicon oxide films.

The second control electrode 60 is provided inside the second trench TR2. The second control electrode 60 is provided between the semiconductor part 10 and the second electrode 30. The second control electrode 60 is electrically insulated from the semiconductor part 10 by a fifth insulating film 65. The second control electrode 60 is electrically insulated from the second electrode by another third insulating film 53. The second control electrode 60 is, for example, a gate electrode. The third electrode 40 is not provided inside the second trench TR2. The second control electrode 60 is, for example, conductive polysilicon. The fifth insulating film 65 is, for example, a silicon oxide film.

The semiconductor part 10 includes, for example, a first semiconductor layer 11 of a first conductivity type, a second semiconductor layer 13 of a second conductivity type, a third semiconductor layer 15 of the first conductivity type, and a fourth semiconductor layer 17 of the first conductivity type. Hereinbelow, the first conductivity type is described as an n-type, and the second conductivity type is described as a p-type.

The first semiconductor layer 11 extends between the first electrode 20 and the second electrode 30. The first semiconductor layer 11 is, for example, an n-type drift layer. The first trench TR1 and the second trench TR2 each extend into the first semiconductor layer 11 from the front surface of the semiconductor part 10 that faces the second electrode 30.

The second semiconductor layer 13 is provided between the first semiconductor layer 11 and the second electrode 30.

Also, the second semiconductor layer 13 is provided between the first trench TR1 and the second trench TR2. The second semiconductor layer 13 is, for example, a p-type diffusion layer. The second semiconductor layer 13 faces the first control electrode 50 via the fourth insulating film 55. Also, the second semiconductor layer 13 faces the second control electrode 60 via the fifth insulating film 65.

The third semiconductor layer 15 is provided between the second semiconductor layer 13 and the second electrode 30. Also, the third semiconductor layer 15 is provided between the first trench TR1 and the second trench TR2. The third semiconductor layer 15 is, for example, an n-type source layer. The third semiconductor layer 15 includes a portion that contacts the fourth insulating film 55, and other portion that contacts the fifth insulating film 65.

The fourth semiconductor layer 17 is provided between the first electrode 20 and the first semiconductor layer 11. The fourth semiconductor layer 17 is, for example, an n-type drain layer. The fourth semiconductor layer 17 includes a first-conductivity-type impurity with a higher concentration than the concentration of the first-conductivity-type impurity of the first semiconductor layer 11, and is electrically connected to the first electrode 20.

As shown in FIG. 1, the first metal layer 33 of the second electrode 30 includes, for example, a contact portion 33c extends into the third semiconductor layer 15 from the front surface of the third insulating film 53. The second electrode 30 is electrically connected to the second and third semiconductor layers 13 and 15 via the contact portion 33c.

In the semiconductor device 1 according to the embodiment, the third electrode 40 is provided in the first semiconductor layer 11 and is electrically insulated from the first semiconductor layer 11 by the first insulating film 43. For example, the first insulating film 43 includes portions provided at the two sides of the third electrode 40, respectively, and arranged in a first direction (an X-direction) that is from the first control electrode 50 toward the second control electrode 60.

A first width WF, i.e., the combined X-direction width of the third electrode 40 and the portions of the first insulating film 43 provided at the two sides of the third electrode 40, is greater than a second width WG, i.e., the combined X-direction width of the first control electrode 50 and the fourth insulating films 55 provided at the two sides of the first control electrode 50 in the X-direction.

As shown in FIG. 1, the third electrode 40 has, for example, a rectangular cross section extending in a Z-direction with a constant X-direction width. The first width WF at the upper end of the third electrode 40 facing the first control electrode 50 via the second insulating film 45 is equal to the first width WF at the lower end of the third electrode 40 facing the first electrode 20 via the first and fourth semiconductor layers 11 and 17.

The embodiment is not limited to the example; the third electrode 40 may have a tapered cross section in which the X-direction width decreases in the direction (the −Z direction) from the second electrode 30 toward the first electrode 20. In other words, at least at the position of the end of the third electrode 40 facing the first control electrode 50 via the second insulating film 45, the third electrode 40 has the widest first width WF.

As shown in FIG. 1, the semiconductor part 10 further includes another first trench TR1 that is next to the second trench TR2. The second trench TR2 is provided between the first trench TR1 and the other first trench TR1. The other third electrode 40 and the other first control electrode 50 are provided inside the other first trench TR1.

The first semiconductor layer 11 includes a first region 11a provided between the first trench TR1 and the other first trench TR1. The second control electrode 60 is provided between the second electrode 30 and the first region 11a of the first semiconductor layer 11. The X-direction width of the first region 11a is greater than the X-direction width of the second control electrode 60.

When the high voltage is applied between the first electrode 20 and the second electrode 30, for example, the high breakdown voltage is required between the first semiconductor layer 11 and the third electrode 40. Thus, the first insulating film 43 has preferably a large film thickness.

On the other hand, to increase the density of the gate channels, the spacing between the first control electrodes that are next to each other is required to be narrow. Thus, the spacing between the third electrodes 40 that are next to each other also becomes narrow. Therefore, the first region 11a of the first semiconductor layer 11 becomes narrow, the path of the current flowing between the first electrode 20 and the second electrode 30 via the first region 11a becomes narrow, and the on-resistance increases. When the film thickness of the first insulating film 43 is increased, the X-direction width of the first region 11a is further reduced, which causes an increase of the on-resistance.

In the semiconductor device 1 according to the embodiment, by providing the second control electrode 60 between the first control electrodes 50 that are next to each other, the density of the gate channels can be increased and the channel resistance can be reduced without reducing the spacing between the third electrodes 40 that are next to each other.

As shown in FIG. 1, the second insulating film 45 includes a first portion that has the first width WF, and a second portion that has the second width WG. The first portion of the second insulating film 45 is continuously linked to the second portion of the second insulating film 45. The boundary between the first and second portions of the second insulating film 45 is positioned at a lower level than the bottom of the trench TR2 in the Z-direction. The spacing between the trench TR1 and the trench TR2 can be increased thereby, and the channel resistance can be reduced.

According to the embodiment, the first width WF of the first trench TR1 is controlled so that the X-direction width of the first region 11a of the first semiconductor layer 11 is greater than the X-direction width of the second control electrode 60. In the semiconductor device 1, the increase of the on-resistance can be prevented thereby.

The second control electrode 60 according to the embodiment is not limited to the examples described above. For example, multiple second control electrodes 60 may be provided between the first control electrodes 50 that are next to each other.

Figure 2A:
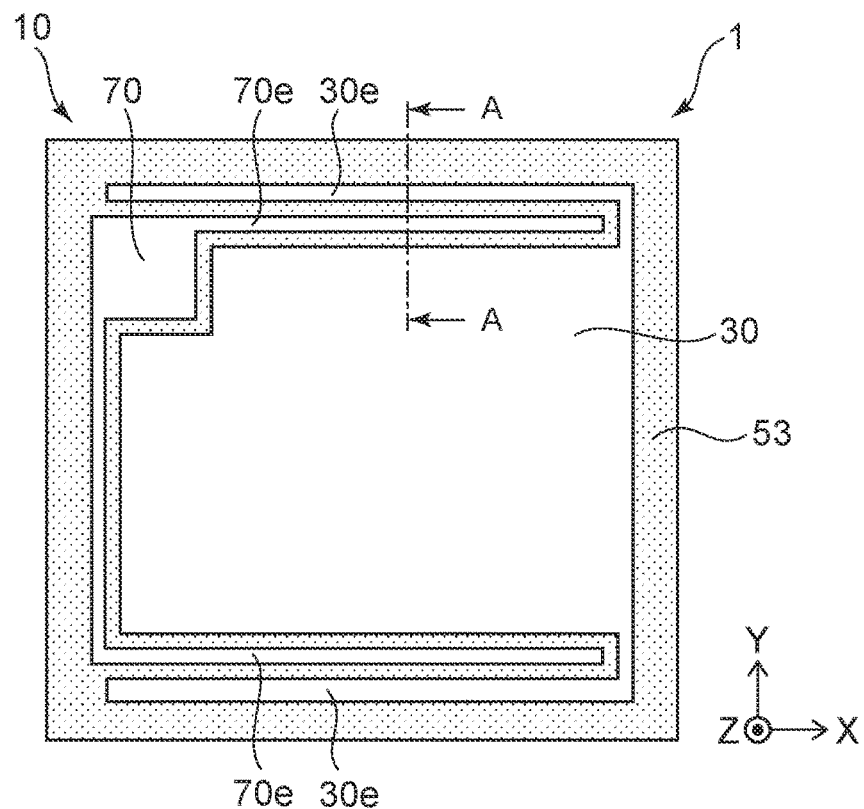
FIGS. 2A and 2B are schematic views showing the semiconductor device according to the embodiment.
Figure 2B:
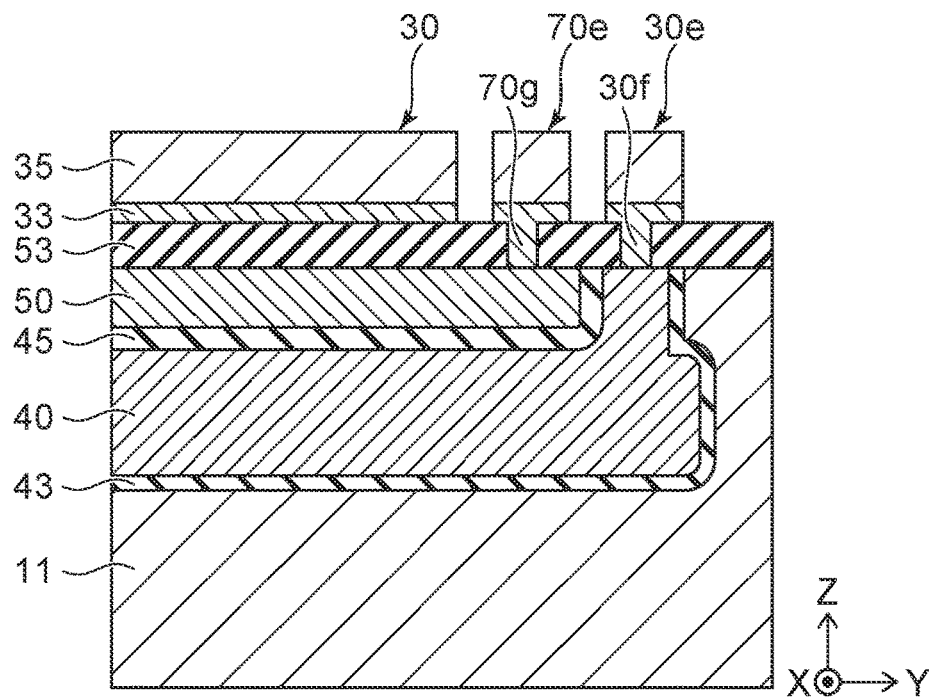

FIGS. 2A and 2B are schematic views showing the semiconductor device 1 according to the embodiment. FIG. 2A is a plan view showing the front side of the semiconductor device 1. FIG. 2B is a cross-sectional view along line A-A shown in FIG. 2A.

As shown in FIG. 2A, the semiconductor device 1 further includes a control pad 70 and control wiring 70e. For example, the control pad 70 and the control wiring 70e are provided at the front side of the semiconductor part 10 with the third insulating film 53 interposed. The control pad 70 and the control wiring 70e are electrically insulated from the semiconductor part 10 by the third insulating film 53. The control pad 70 and the control wiring 70e are apart from the second electrode 30 and are electrically isolated from the second electrode 30.

The control wiring 70e is connected to the control pad 70. The control wiring 70e extends along the second electrode 30 from the control pad 70. The second electrode 30 includes, for example, an extension portion 30e that extends along the outer edge of the semiconductor part 10. The control wiring 70e extends between the extension portion 30e and the major portion of the second electrode 30.

As shown in FIG. 2B, the control wiring 70e has the same stacked structure as the second electrode 30. The control wiring 70e is electrically connected to the first control electrode 50 via a contact portion 70g that extends into the third insulating film 53. The control wiring 70e is similarly electrically connected to the second control electrode 60.

The extension portion 30e of the second electrode 30 is electrically connected to the third electrode 40 via a contact portion 30f that extends into the third insulating film 53. In other words, the second electrode 30 is electrically connected to the third electrode 40 via the extension portion 30e that includes the contact portion 30f.

A method for manufacturing the semiconductor device 1 will now be described with reference to FIGS. 3A to 12B. FIGS. 3A to 12B are schematic cross-sectional views showing the manufacturing processes of the semiconductor device 1 according to the embodiment.

Figure 3A:
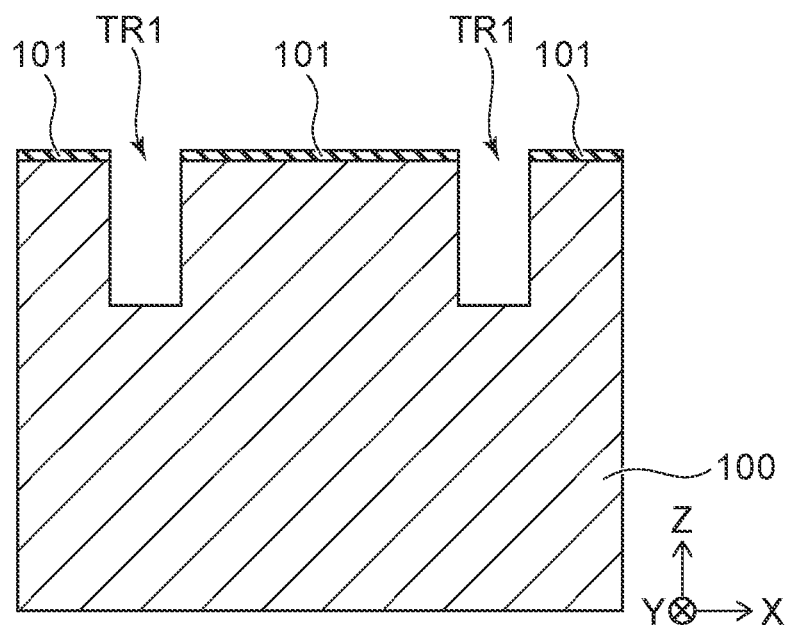
FIGS. 3A to 12B are schematic cross-sectional views showing manufacturing processes of the semiconductor device according to the embodiment.

As shown in FIG. 3A, the first trench TR1 is formed in the front side of a semiconductor wafer 100. An insulating film 101 is formed on the front surface of the semiconductor wafer 100. Then, the first trench TR1 is formed by selectively etching the semiconductor wafer using the insulating film 101 as a mask. Multiple first trenches TR1 are formed along the front surface of the semiconductor wafer 100.

The semiconductor wafer 100 is, for example, a silicon wafer of the first conductivity type. The semiconductor wafer 100 has, for example, a structure in which the first semiconductor layer 11 is epitaxially grown on a substrate of the first conductivity type (not illustrated) that is used to form the fourth semiconductor layer 17. The insulating film 101 is, for example, a silicon oxide film. The insulating film 101 is formed by, for example, thermal oxidation of the semiconductor wafer 100. The semiconductor wafer 100 is etched using, for example, anisotropic RIE (Reactive Ion Etching).

Figure 3B:
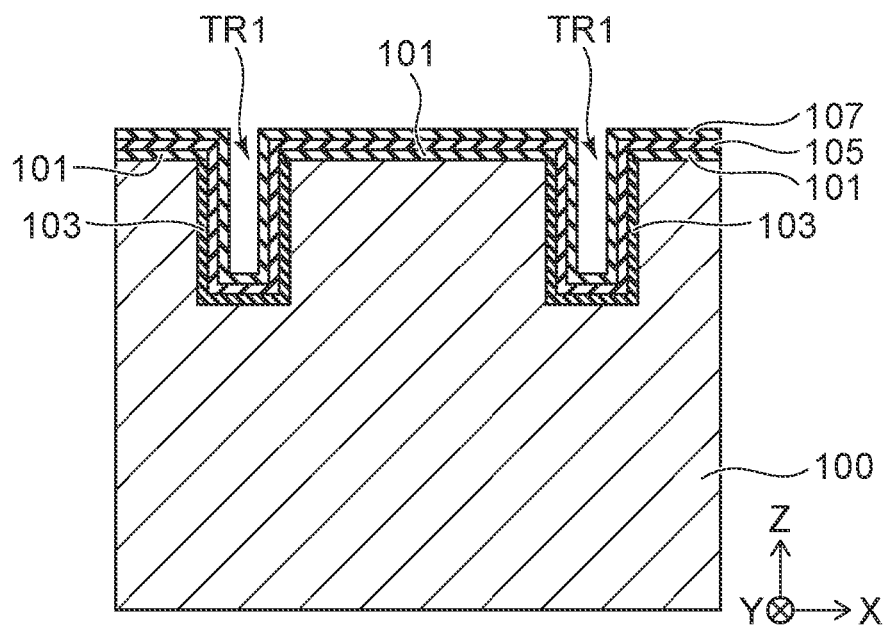

As shown in FIG. 3B, insulating films 103, 105 and 107 are formed so that a space remains inside the first trench TR1. The insulating films 103, 105 and 107 cover the inner surface of the first trench TR1. The semiconductor wafer 100 exposed at the inner surface of the first trench TR1 is, for example, thermally oxidized, and thereby, the insulating film 103 is formed on the inner surface of the first trench TR1. The insulating film 103 is, for example, a silicon oxide film. The insulating film 105 is, for example, a silicon nitride film. The insulating film 107 is, for example, a silicon oxide film. The insulating films 105 and 107 are deposited on the front side of the semiconductor wafer 100 by using, for example, CVD (Chemical Vapor Deposition).

Figure 4A:
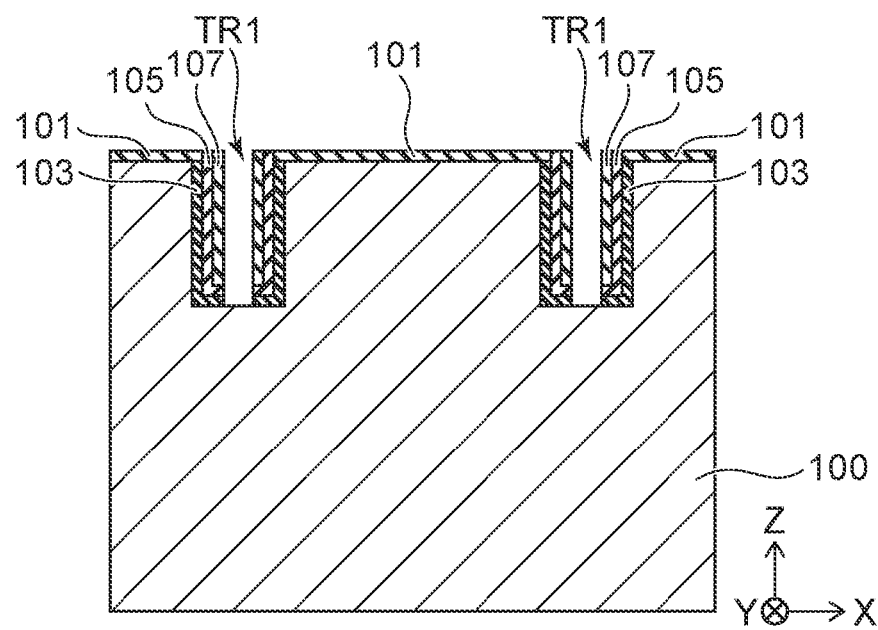

As shown in FIG. 4A, the insulating films 103, 105 and 107 are selectively removed. The portions of the insulating films 103, 105 and 107 that are formed on the bottom surface of the first trench TR1 are selectively removed using, for example, anisotropic RIE; and a portion of the semiconductor wafer 100 is exposed. At this time, the portions of the insulating films 105 and 107 that are formed on the insulating film 101 also are removed at the front surface side of the semiconductor wafer 100.

Figure 4B:
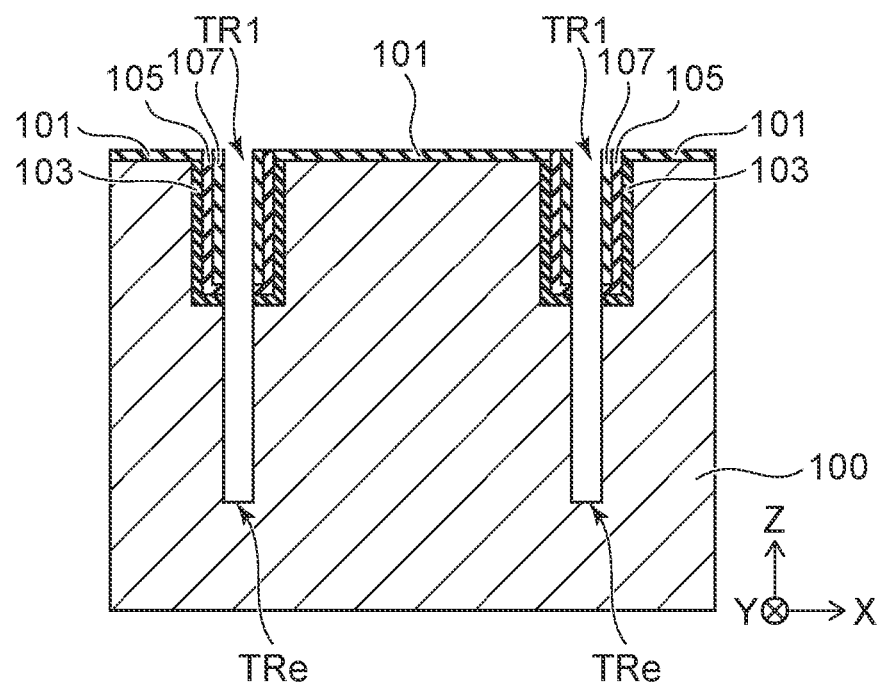

As shown in FIG. 4B, the first trench TR1 is further extended in the depth direction (the −Z direction) by etching the semiconductor wafer 100 exposed at the bottom surface of the first trench TR1. The semiconductor wafer 100 is etched using, for example, anisotropic RIE.

Figure 5A:
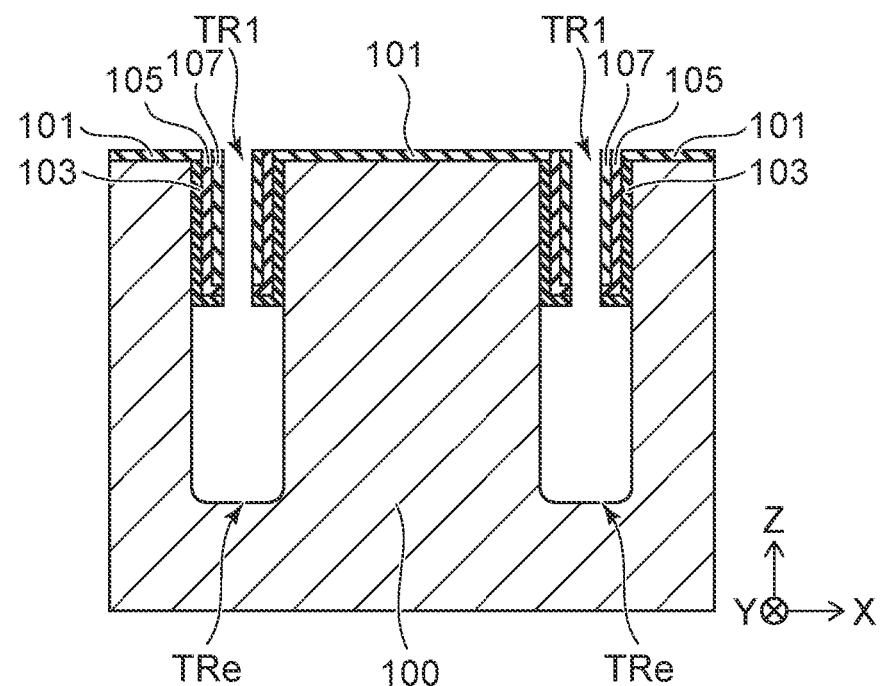

As shown in FIG. 5A, the semiconductor wafer 100 is etched at an extension portion TRe of the first trench TR1, and the extension portion Tre is enlarged. In this process, the semiconductor wafer 100 is etched isotropically using, for example, CDE (Chemical Dry Etching).

The insulating films 101, 103, 105, and 107 act as anti-etching films in the processes shown in FIGS. 4B and 5A.

Figure 5B:
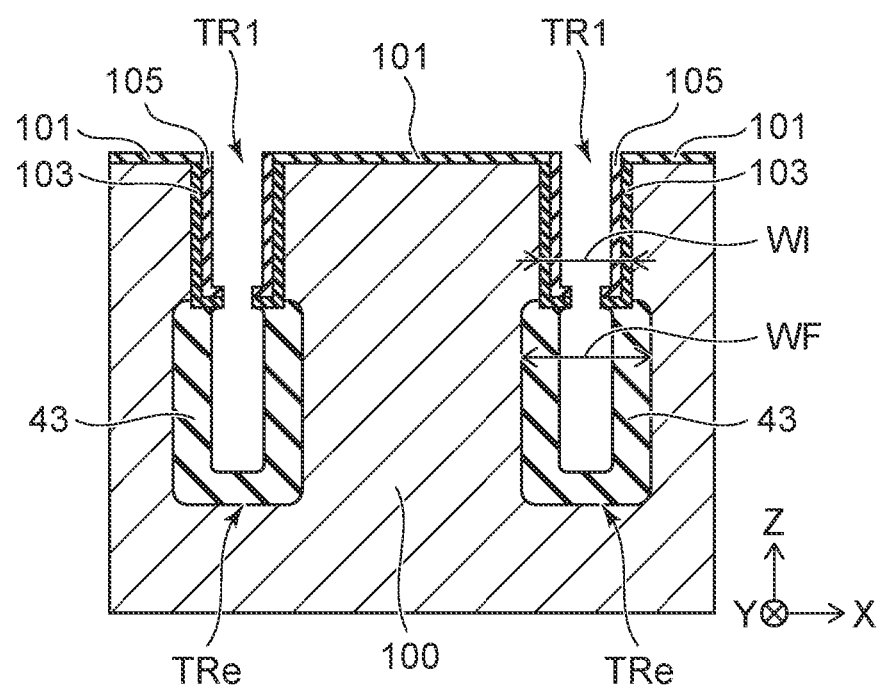

As shown in FIG. 5B, the first insulating film 43 is formed to cover the inner surface of the extension portion TRe of the first trench TR1. The first insulating film 43 is formed so that the desired space remains inside the extension portion TRe. The first insulating film 43 is, for example, a silicon oxide film. The first insulating film 43 is formed by thermal oxidation of the semiconductor wafer 100 exposed at the inner surface of the extension portion TRe of the first trench TR1.

By forming the first insulating film 43, the extension portion TRe of the first trench TR1 is widened and has the first width WF that is further enlarged. The insulating film 105 suppresses the thermal oxidation at the upper portion of the first trench TR1. As a result, the first width WF is greater than a width WI of the upper portion of the first trench TR1. The insulating film 107 is removed by wet processing before the first insulating film 43 is formed.

Figure 6A:
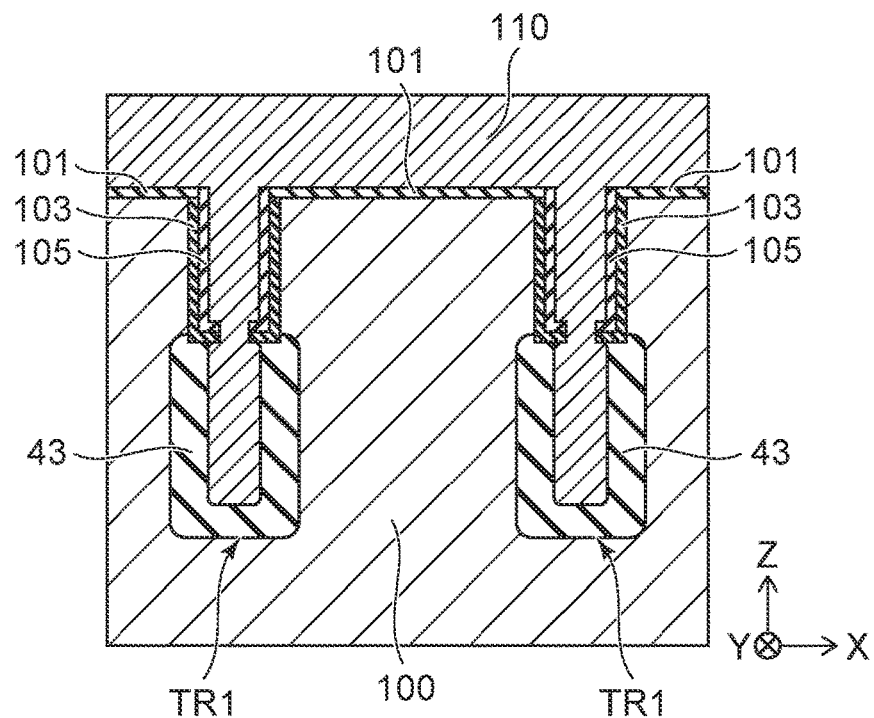

As shown in FIG. 6A, a conductive film 110 is formed in the front side of the semiconductor wafer 100. The interior of the first trench TR1 is filled with the conductive film 110. The conductive film 110 is, for example, conductive polysilicon. The conductive film 110 is formed using, for example, CVD.

Figure 6B:
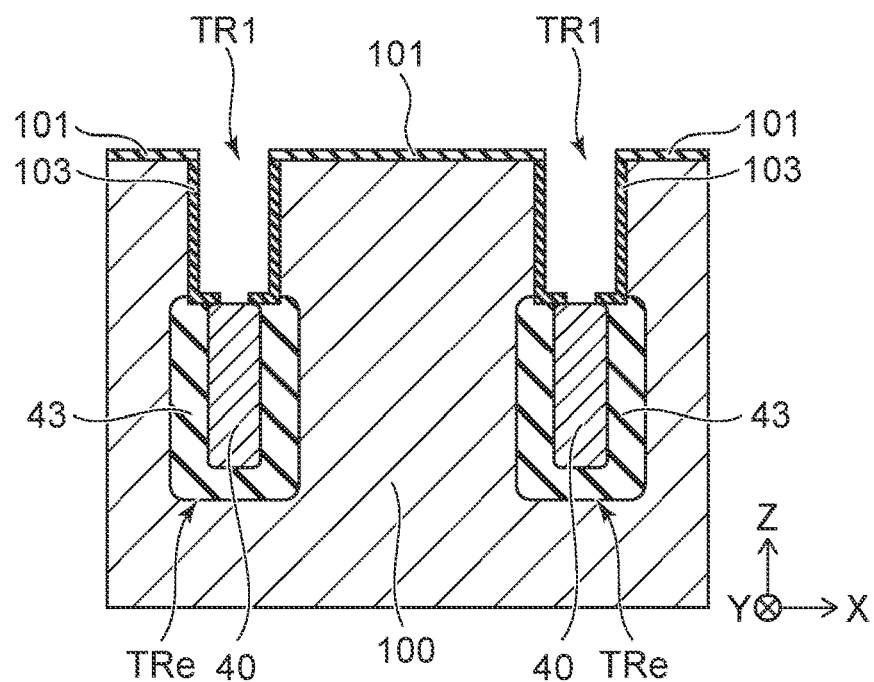

As shown in FIG. 6B, the conductive film 110 is removed so that a portion thereof remains in the extension portion TRe of the first trench TR1. The portion of the conductive film 110 that is filled into the extension portion TRe becomes the electrode that is provided in the first semiconductor layer 11 (i.e., the third electrode 40). The conductive film 110 is removed by, for example, wet etching. The insulating film 105, for example, is removed together with the conductive film 110.

Figure 7A:
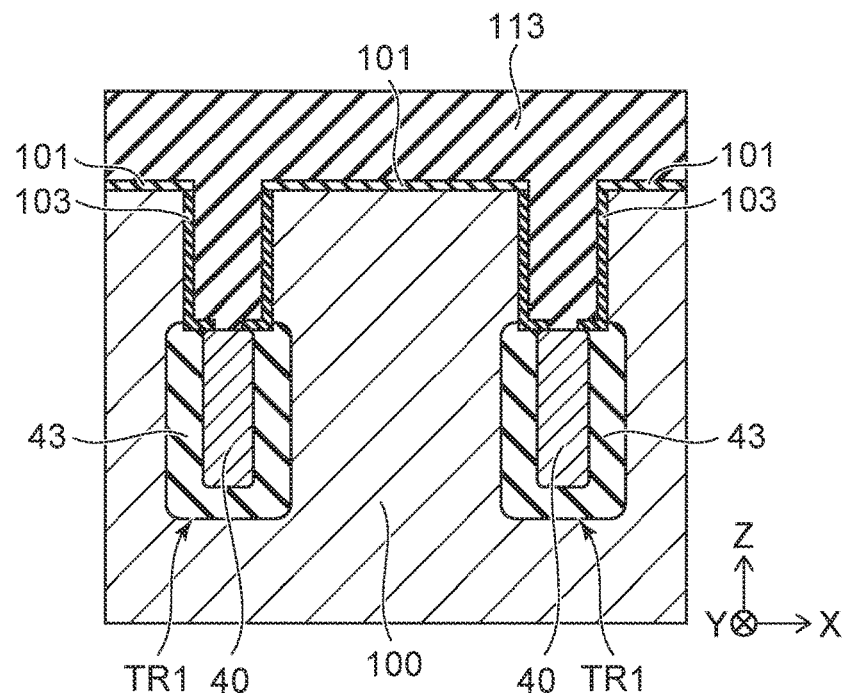

As shown in FIG. 7A, an insulating film 113 is formed at the front side of the semiconductor wafer 100. The space in the first trench TR1 which is formed by removing the conductive film 110 is filled with the insulating film 113. The insulating film 113 is, for example, a silicon oxide film formed using CVD.

Figure 7B:
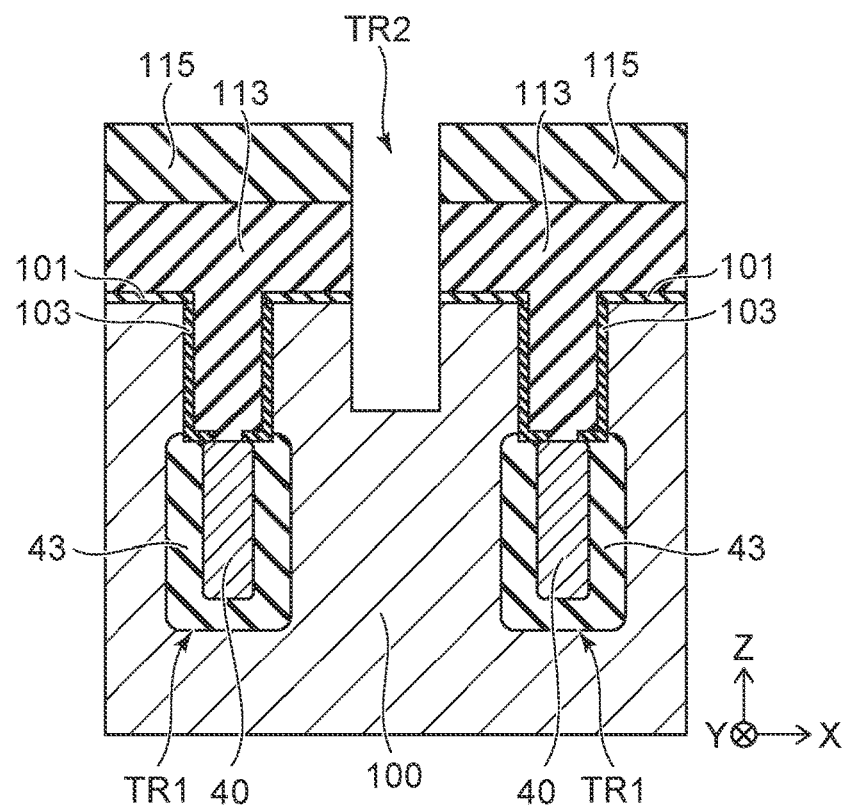

As shown in FIG. 7B, the second trench TR2 is formed between the first trenches TR1 that are next to each other. The second trench TR2 is formed by, for example, anisotropic RIE using an etching mask 115. The second trench TR2, for example, is formed to extend into the semiconductor wafer 100 from the front surface of the insulating film 113. The second trench TR2, for example, is formed so that the bottom of the second trench TR2 is positioned higher than the upper end of the third electrode 40 in the Z-direction.

Figure 8A:
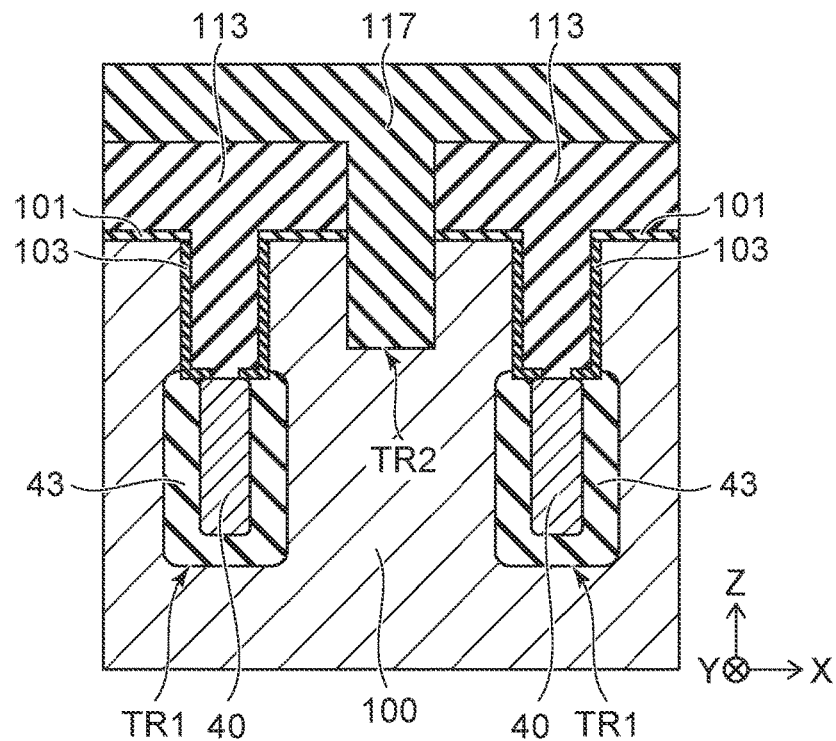

As shown in FIG. 8A, an insulating film 117 is formed at the front side of the semiconductor wafer 100. The second trench TR2 is filled with the insulating film 117. The insulating film 117 is, for example, a silicon oxide film formed using CVD.

Figure 8B:
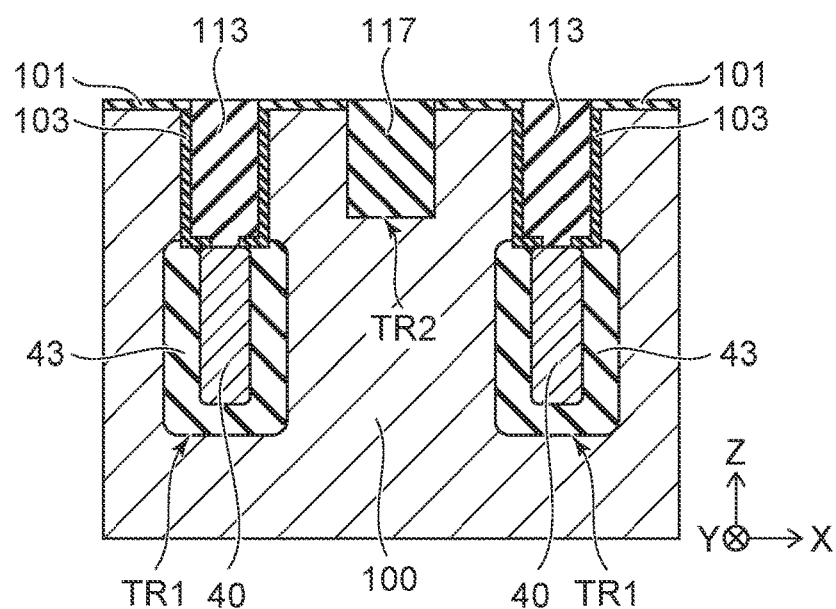

As shown in FIG. 8B, the insulating films 113 and 117 are removed so that the portions that fill the first trench TR1 and the second trench TR2 remain. The insulating film 113 and the insulating film 117 are removed using, for example, CMP (Chemical Mechanical Polishing) and wet etching.

Figure 9A:
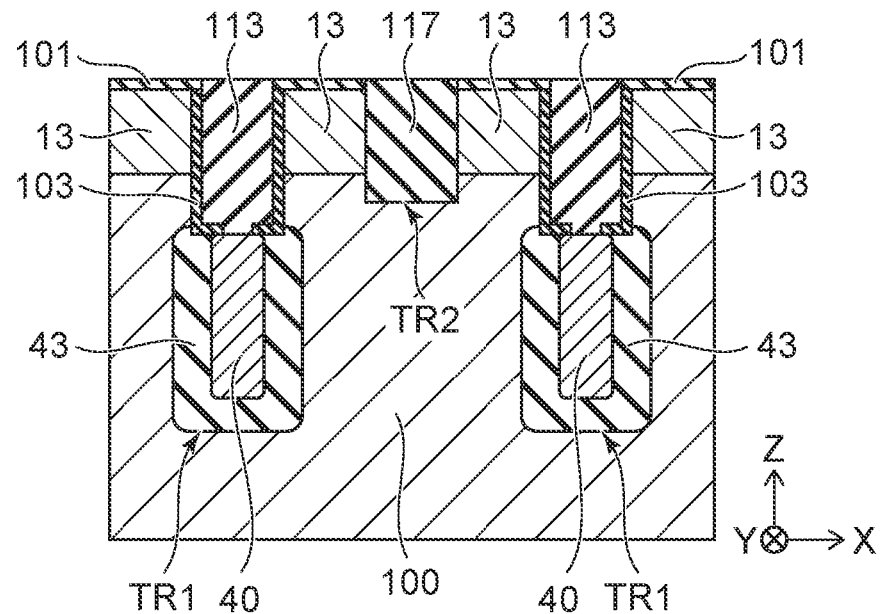

As shown in FIG. 9A, the second semiconductor layer 13 is formed in the front side of the semiconductor wafer 100. The second semiconductor layer 13 is formed by, for example, ion-implanting a second-conductivity-type impurity such as boron (B), etc., into the front side of the semiconductor wafer 100. The second-conductivity-type impurity that is ion-implanted into the semiconductor wafer 100 is activated and diffused by heat treatment. The second semiconductor layer 13 is formed so that the boundary between the first semiconductor layer 11 and the second semiconductor layer 13 is positioned at a shallower level than the bottom of the second trench TR2.

Figure 9B:
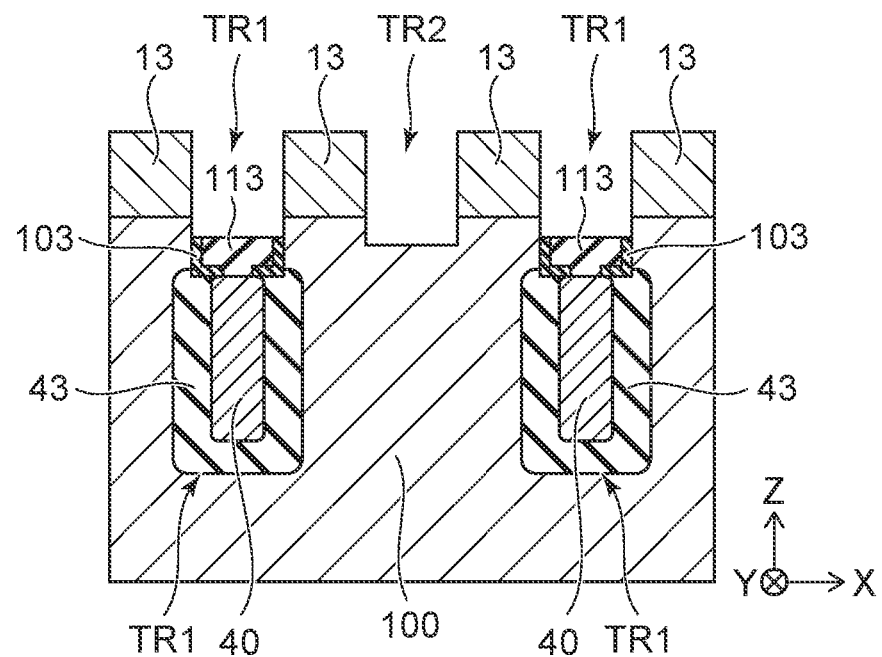

As shown in FIG. 9B, the second semiconductor layer 13 is exposed by removing the insulating films 101, 103, 113 and 117. Portions of the insulating films 103 and 113 remain in the first trench TR1. The entire insulating film 117 formed inside the second trench TR2 is removed.

Figure 10A:
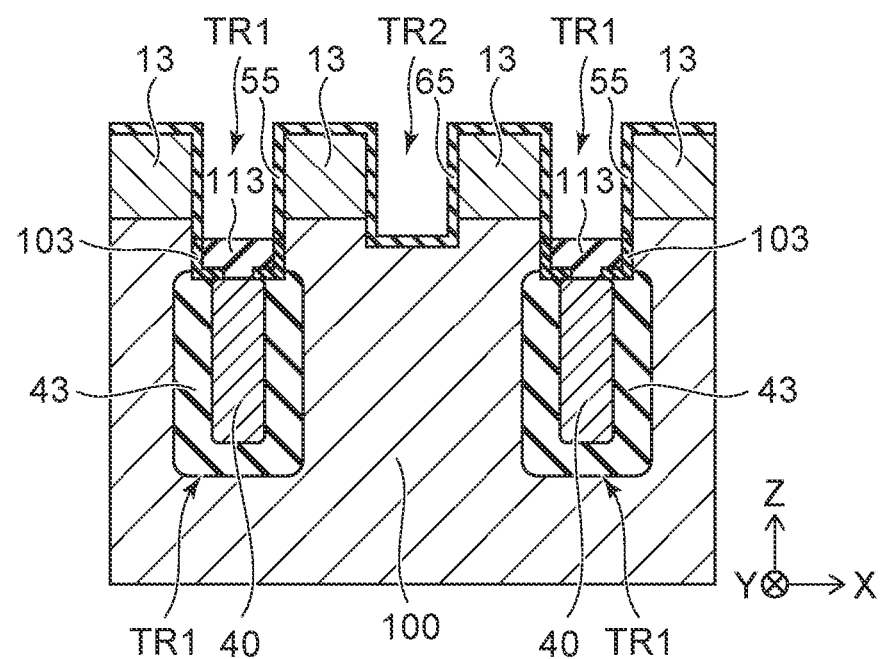

As shown in FIG. 10A, the fourth insulating film 55 and the fifth insulating film 65 are formed respectively inside the first trench TR1 and the second trench TR2. The fourth insulating film 55 and the fifth insulating film 65 are formed by thermal oxidation of the exposed portions of the semiconductor wafer 100. The fourth insulating film 55 and the fifth insulating film 65 are, for example, silicon oxide films.

Figure 10B:
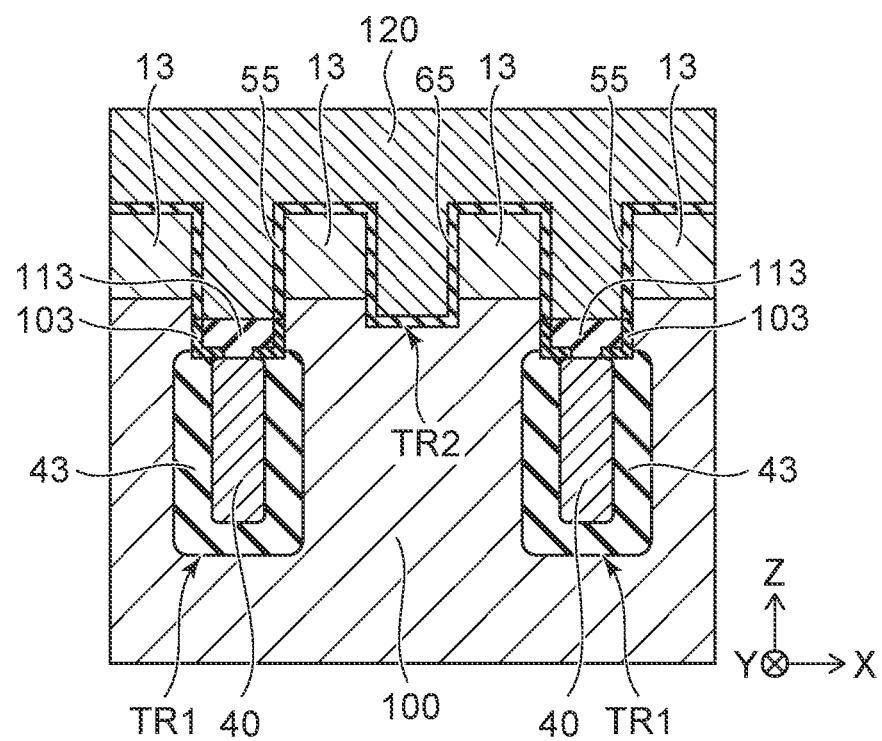

As shown in FIG. 10B, a conductive film 120 is formed at the front side of the semiconductor wafer 100. The first trench TR1 and the second trench TR2 are filled with the conductive film 120. The conductive film 120 is, for example, conductive polysilicon. The conductive film 120 is formed using, for example, CVD.

Figure 11A:
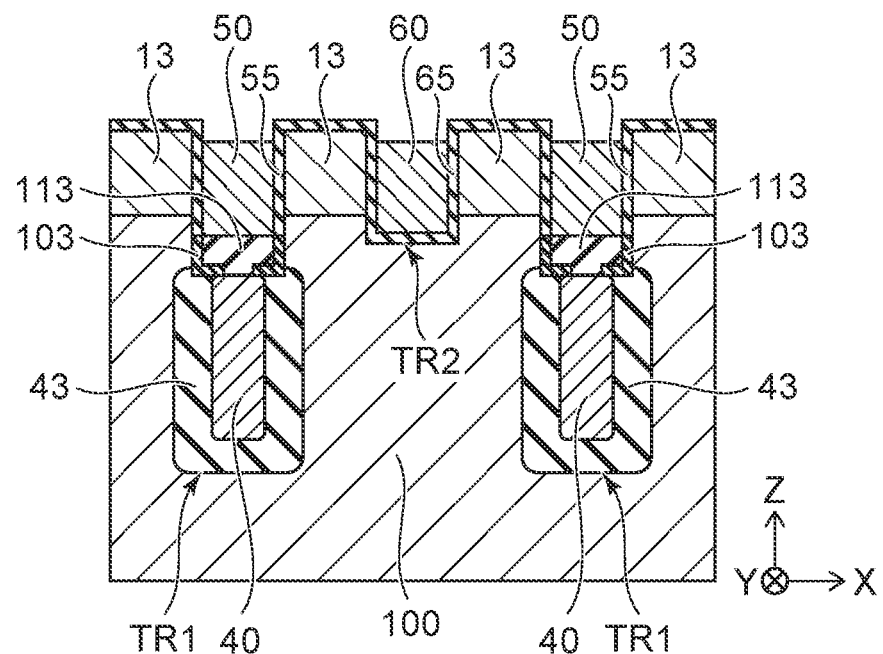

As shown in FIG. 11A, the first control electrode 50 and the second control electrode 60 are formed respectively inside the first trench TR1 and the second trench TR2. The first control electrode 50 and the second control electrode 60 are formed by removing the conductive film 120 (referring to FIG. 10B) so that the portions formed inside the first trench TR1 and the second trench TR2 remain. The conductive film 120, for example, is isotropically etched by CDE.

Figure 11B:
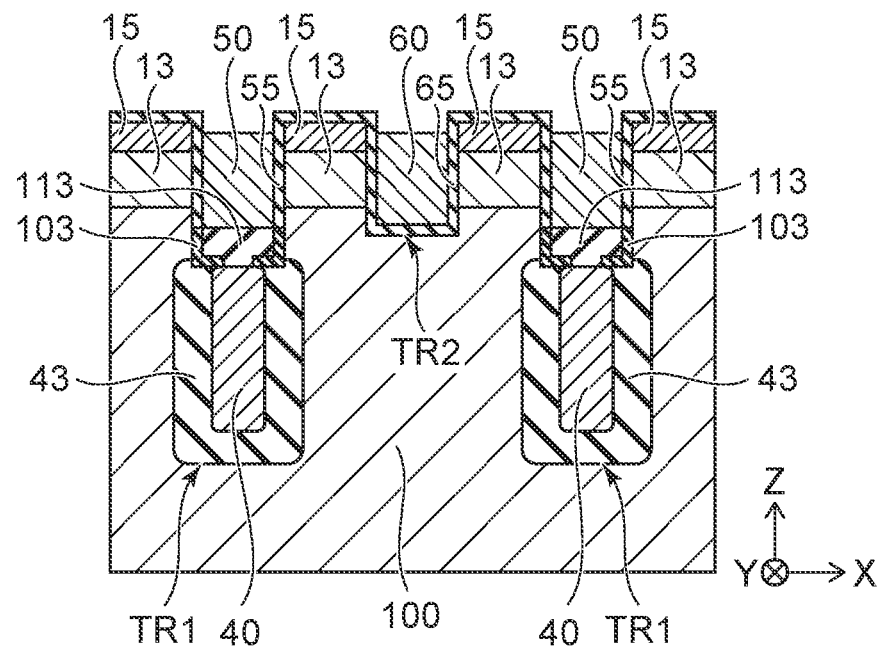

As shown in FIG. 11B, the third semiconductor layer 15 is formed in the front side of the semiconductor wafer 100. The third semiconductor layer 15, for example, is formed by ion-implanting a first-conductivity-type impurity such as phosphorus (P), etc. The ion-implanted first-conductivity-type impurity is activated by heat treatment. The third semiconductor layer 15 is formed on the second semiconductor layer 13.

Figure 12A:
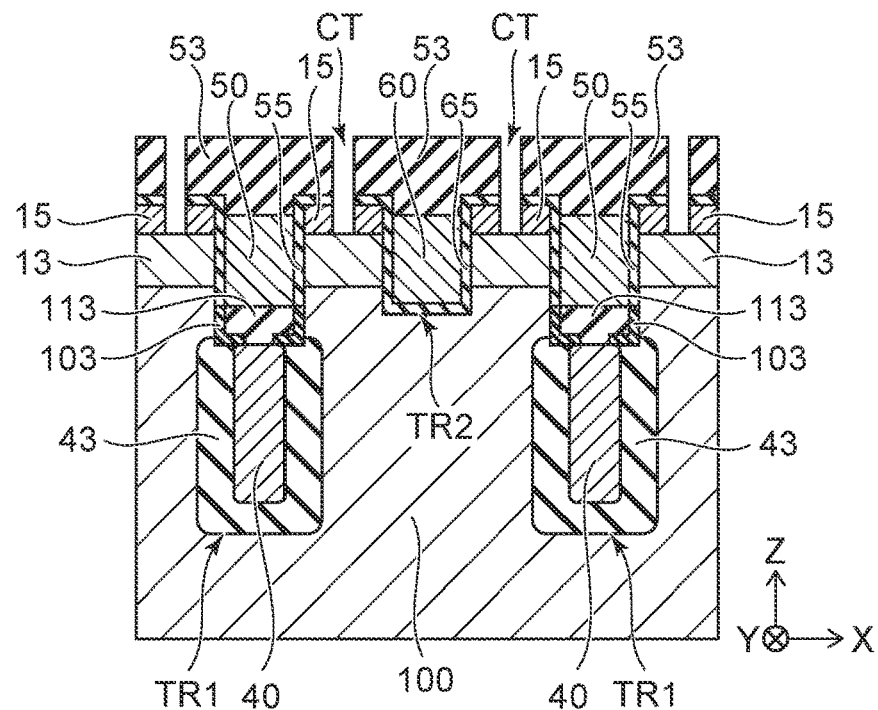

As shown in FIG. 12A, the third insulating film 53 is formed on the first and second control electrodes 50 and 60. The third insulating film 53 is, for example, a silicon oxide film. The third insulating film 53 is formed using, for example, CVD at the front side of the semiconductor wafer 100.

A contact trench CT is formed to communicate from the front surface of the third insulating film 53 to the second semiconductor layer 13. The contact trench CT is formed using, for example, anisotropic RIE.

Figure 12B:
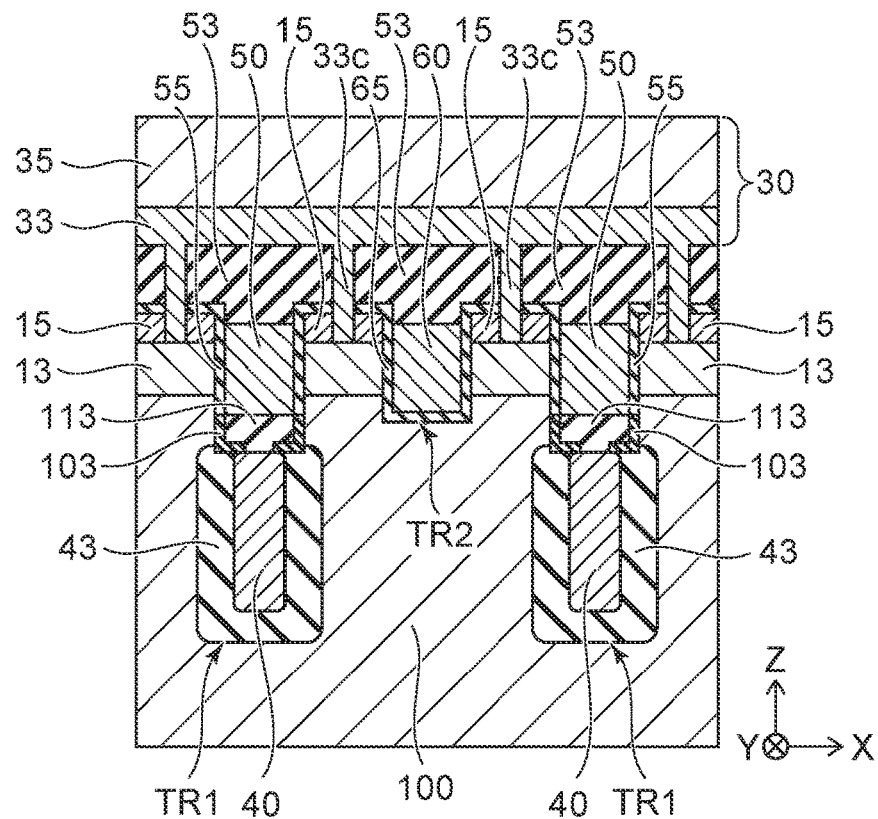

As shown in FIG. 12B, the second electrode 30 is formed at the front side of the semiconductor wafer 100. The second electrode 30 is formed by depositing the first metal layer 33 and the second metal layer 35 in this order on the third insulating film 53. The first metal layer 33, for example, has a stacked structure that includes titanium nitride (TiN) and tungsten (W). The first metal layer 33 is formed using, for example, sputtering and CVD. The second metal layer 35 includes, for example, aluminum (Al) formed using sputtering.

The contact trench CT is filled with the first metal layer 33. The portion of the first metal layer 33 that extends into the contact trench CT is electrically connected to, for example, the second semiconductor layer 13 and the third semiconductor layer 15.

The backside of the semiconductor wafer 100 is thinned to the prescribed wafer thickness by, for example, grinding or polishing. Subsequently, the first electrode 20 is formed on the back surface of the semiconductor wafer 100; and the semiconductor device 1 is completed. The first electrode 20 has a stacked structure that includes, for example, nickel (Ni) and aluminum (Al). The first electrode 20 is formed using, for example, sputtering.

Figure 13:
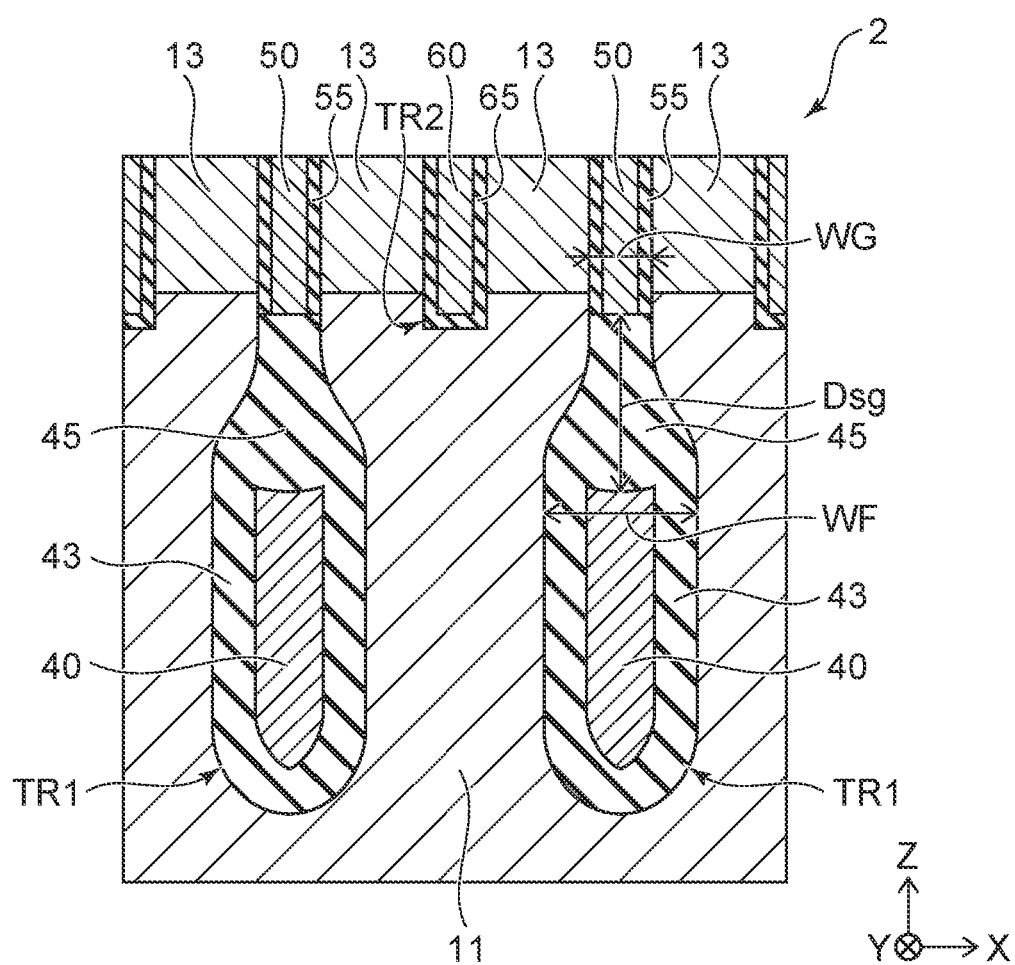
FIG. 13 is a cross-sectional view schematically showing a semiconductor device according to a modification of the embodiment.

FIG. 13 is a partial cross-sectional view schematically showing a semiconductor device 2 according to a modification of the embodiment. Also, in the semiconductor device 2, the third electrode 40 and the first control electrode 50 are provided inside the first trench TR1. The second control electrode 60 is provided inside the second trench TR2. The third electrode 40 is not provided inside the second trench TR2.

In the first trench TR1, the first width WF, i.e., the combined X-direction width of the third electrode 40 and the portions of the first insulating film 43 provided at the two sides of the third electrode 40, is greater than the second width WG, i.e., the combined X-direction width of the first control electrode 50 and the fourth insulating films 55 provided at the two sides of the first control electrode 50.

The third electrode 40 is provided in the first semiconductor layer 11. The first control electrode 50 is provided with a wide spacing Dsg between the third electrode 40 and the first control electrode 50. The spacing Dsg, for example, is greater than the second width WG. The parasitic capacitance between the third electrode 40 and the first control electrode 50 can be reduced thereby. The spacing Dsg can be increased by lowering the upper end of the third electrode 40 by, for example, increasing the etching amount of the conductive film 110 in the manufacturing processes shown in FIGS. 6A and 6B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part including a first semiconductor layer of a first conductivity type, a second semiconductor layer of a second conductivity type, and a third semiconductor layer of the first conductivity type;
a first electrode provided on a back surface of the semiconductor part;
a second electrode provided at a front side of the semiconductor part;
a third electrode provided between the first electrode and the second electrode, the third electrode being provided in a first trench at the front side of the semiconductor part, the third electrode being electrically insulated from the semiconductor part by a first insulating film;
a first control electrode provided between the second electrode and the third electrode, the first control electrode being provided in the first trench, the first control electrode being electrically insulated from the third electrode by a second insulating film, electrically insulated from the second electrode by a third insulating film, and electrically insulated from the semiconductor part by a fourth insulating film; and
a second control electrode provided between the semiconductor part and the second electrode, the second control electrode being provided in a second trench next to the first trench in the front side of the semiconductor part, the second control electrode being electrically insulated from the semiconductor part by a fifth insulating film,
the first semiconductor layer extending between the first electrode and the second electrode,
the second semiconductor layer being provided between the first semiconductor layer and the second electrode, the second semiconductor layer facing the first control electrode via the fourth insulating film, and facing the second control electrode via the fifth insulating film,
the third semiconductor layer being partially provided between the second semiconductor layer and the second electrode, the second electrode being electrically connected to the second and third semiconductor layers,
the first trench and the second trench extending into the first semiconductor layer from the front surface of the semiconductor part, a distance between the first trench and the first electrode being less than a distance between the second trench and the first electrode,
the third electrode in the first trench facing the first semiconductor layer via the first insulating film, the first insulating film including first and second portions provided respectively at two sides of the third electrode, the first and second portions being arranged in a first direction directed from the first control electrode toward the second control electrode,
the fourth insulating film including first and second portions provided respectively at two sides of the first control electrode, the first and second portions of the fourth insulating film being arranged in the first direction,
the first trench having first and second width in the first direction, the first width being a combined width of the third electrode and the first and second portions of the first insulating film, the second width being a combined width of the first control electrode and the first and second portions of the fourth insulating film, the first width being greater than the second width.

2. The device according to claim 1, wherein the first width is widest at least at a first end of the third electrode, the first end of the third electrode facing the first control electrode via the second insulating film.

3. The device according to claim 1, wherein the third electrode has first and second ends, the first end facing the first control electrode via the second insulating film, the second end facing the first electrode via the first semiconductor layer, and the first width is the same at the first end and the second end of the third electrode.

4. The device according to claim 1, wherein the second insulating film includes first and second portions arranged in a second direction directed from the third electrode toward the first control electrode, the first portion having a width in the first direction equal to the first width, the second portion having another width in the first direction equal to the second width.

5. The device according to claim 4, wherein
the second portion of the second insulating film is continuously linked to the first portion of the second insulating film, and
a boundary between the first and second portions of the second insulating film is positioned at a lower level in the second direction than a bottom of the second trench.

6. The device according to claim 1, further comprising:
another third electrode next to the third electrode in the first direction; and
another first control electrode next to the second control electrode in the first direction,
the semiconductor part further including another first trench next to the second trench in the first direction, the second trench being provided between the first trench and said another first trench,
said another third electrode and said another first control electrode being provided inside said another first trench, the first semiconductor layer including a region provided between the third electrode and said another third electrode, the region of the first semiconductor layer being positioned between the first electrode and the second control electrode,
the region of the first semiconductor layer having a width in the first direction, the width of the region in the first semiconductor layer being greater than a width in the first direction of the second control electrode.

7. The device according to claim 1, wherein
the third electrode has a first end facing the first control electrode via the second insulating film, and
a distance between a bottom of the second trench and the second electrode is shorter than a distance between the first end of the third electrode and the second electrode.

8. The device according to claim 7, wherein
a distance in the second direction between the third electrode and the first control electrode is greater than the second width.

* * * * *